July 10, 1973 R. L. BRENNEMAN ET AL 3,745,045

ELECTRICAL CONTACT SURFACE USING AN INK CONTAINING A PLATING CATALYST

Filed Jan. 6, 1971 2 Sheets-Sheet 1

United States Patent Office 3,745,045

Patented July 10, 1973

3,745,045

ELECTRICAL CONTACT SURFACE USING AN INK CONTAINING A PLATING CATALYST

Richard Lee Brenneman, 25 Falcon Court, Mechanicsburg, Pa. 17055, and Richard Henry Zimmerman, 50 Sycamore Lane, Palmyra, Pa. 17078

Filed Jan. 6, 1971, Ser. No. 104,391
Int. Cl. B41m 3/08
U.S. Cl. 117—212 4 Claims

ABSTRACT OF THE DISCLOSURE

A conductive surface of the type engaged by a contact spring is formed by depositing an ink carrying a plating catalyst on an insulating substrate and plating the inked surface with an electroless plating material. The ink incorporates a catalyzing agent in the form of particles or flakes of nickel or aluminum to produce an even and adequate reduction of electroless plating onto the surface thereof. Precisely defined contact surfaces which may be extended through small holes in a supporting and insulating substrate are made using the foregoing materials. The ink may additionally be made conductive, if desired.

BACKGROUND OF THE INVENTION

Printed circuit boards have come to be widely used to define electrical circuit paths including contact surfaces engaged by contact springs to provide connections to such paths. A conventional printed circuit board is comprised of a thermosetting plastic sheet having a layer of copper bonded to one or both surfaces. Typical copper thicknesses are 0.0014 and 0.0028 of an inch. To prevent oxidation products from building up an insulating film on the copper, conductive materials such as silver or gold are electroplated onto the surface of the copper foil. A typical protective finish employs 0.00005 of an inch of gold over 0.0001 of an inch of nickel over the copper foil. The protective finish is electroplated onto the copper either before or after etching to define circuit paths and contact pads. If the board areas are small and must be precisely defined the finish is applied prior to etching.

In certain instances a large number of very small, individual contact areas are required. For example, in one known application calling for individual read-out of data cards some 264 individual contact pads, in the form of a 12 x 22 matrix array, must be located within an area of about 2 x 4 inches. Moreover, the contact surface areas must be accessible to permit multiple contact springs to engage the pads. Some 264 conductive paths must then be provided to connect the individual pads, thus complicating the problem.

Contact spring systems utilizing printed circuit boards are found in many applications for card readers, edge connectors, switches, and other electrical devices. A card reader using a printed circuit-contact spring assembly is disclosed in U.S. Pat. No. 3,352,981 to G. R. Ekers, granted Nov. 14, 1967. An edge connector for printed circuit boards is disclosed in U.S. Pat. No. 3,173,737 to R. J. Kinkaid et al., granted Mar. 16, 1965. Also, U.S. Pat. No. 3,348,102 to C. W. Bosland et al., granted on Oct. 17, 1967, teaches a multiple switch of a type which may utilize a printed circuit board.

SUMMARY OF THE INVENTION

The present invention relates to a method and means for providing electrical contact surfaces of improved characteristics which may be precisely defined on an insulating substrate or through small holes therein.

It is an object of the present invention to provide a method for forming an inexpensive but high quality electrical contact system. It is another object to provide a contact system comprised of inexpensive materials capable of use in applications requiring a long contact life. It is a further object to provide contact surfaces which include portions necessarily located in small holes or recesses in an insulating member. It is a general object of the invention to provide improvements in the printed circuit art directed toward increasing the life of contact surfaces and permitting the use of printed circuit techniques for devices having large numbers of rather precisely located conductive paths and/or devices having a large number of very small, individual contact areas which must be closely spaced.

The foregoing objectives are attained by the present invention through the use of an ink deposited on an insulating substrate in any suitable manner, such as by coating, painting, or silk screening. The ink is made to include certain catalytic particles that initiate the reduction and insure even coverage by an electroless plate onto the inked surface. Other particles may also be included in the ink to make the ink conductive. In a preferred embodiment for use with contact spring members arranged to engage and bear against such contact surfaces, the conductive ink is deposited in very small apertures extended through the insulating substrate supporting the contact surfaces to facilitate individual termination of a large number of individual contact surfaces defined thereon.

DESCRIPTION OF PREFERRED EMBODIMENT

The invention will be illustrated in a typical embodiment, which is that of a data card reader. Reference is made to U.S. Pat. No. 3,513,299 to W. W. Loose, granted on May 19, 1970, for a general teaching of a card reader mechanism of the type contemplated as using the contact surface of the present invention.

Figures 1, 2:
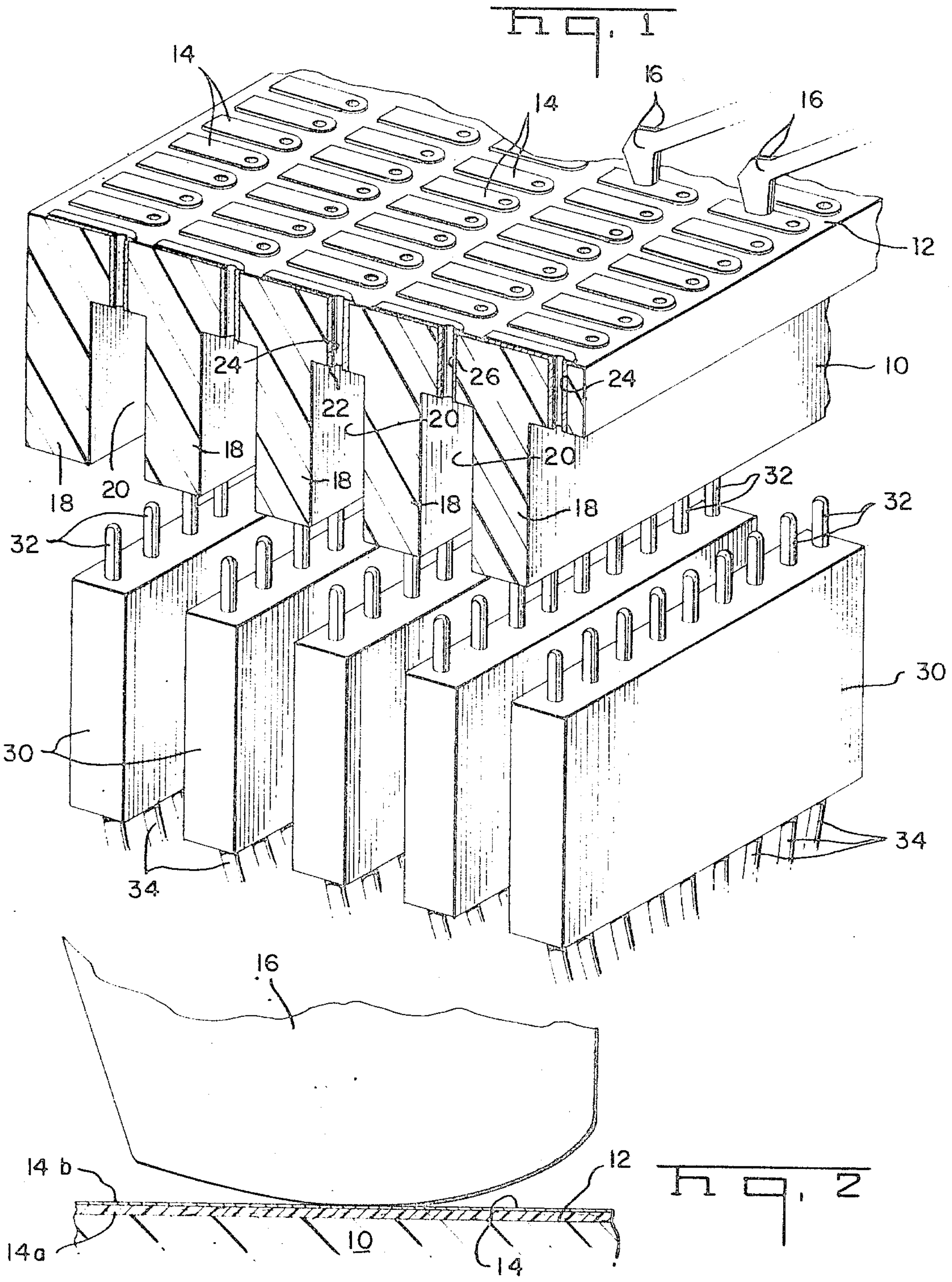
FIG. 1 is a perspective view showing, somewhat enlarged from actual size, printed circuit surfaces as applied to an individual input card reader structure.
FIG. 2 is a side and partially sectioned view showing the end of a contact spring in engagement with a contact surface formed in accordance with the invention, the showing being enlarged many times actual-size.

In FIG. 1, reference numeral 10 denominates a lower contact carrying block of a card reader, the upper surface 12 of which contains a series of conductive contact surfaces 14 arranged in rows and columns of a matrix array. The contact surfaces or pads 14 are generally positioned in accordance with the location of bit positions in a data card which are usually defined by rectangular or circular holes punched in the card at selected bit positions. Positioned above the aforesaid surface 12 are plural contact springs 16, only two of which are shown, it being understood that in normal practice a separate contact spring 16 is provided for each contact surface 14. In use, a data card is placed over the surface 12 and a contact spring mounting block (not shown) is then displaced toward the surface 12 until the springs 16 bear against the data card or else pass through holes in such card to engage underlying contact surfaces 14, thereby closing selected electrical circuit paths in the card reader to read out the data card information. Reference is made to the aforementioned W. W. Loose Pat. No. 3,513,299 for a disclosure of a mechanism including a contact spring block and means to drive such block up and down to effect an inner connection of selected contact springs with their respective contact surfaces. Reference is made to the aforementioned G. R. Ekers Pat. No. 3,352,981 for a disclosure of a mechanism including a fixed contact spring block and means to drive a printed circuit board toward and into engagement with contact springs.

The disposition of contact surfaces 14 as shown in FIG. 1 is for an individual input; however, the more typical arrangement provides contact surfaces which are continuous along rows or along columns in the manner depicted in the aforementioned W. W. Loose patent. Those applications which do require individual inputs, one for each data card bit position, pose an especially difficult interconnection problem in that electrical connections to or from each contact surface must be made without interfering with the closure of contact springs against contact surfaces. Moreover, for the standard bit spacing found on many data cards it is difficult to make a surface or pad such as the contact surface 14 large enough to accommodate all tolerances in the reader mechanism and in the card itself without then having the individual contact surfaces so close together as to result in a shorting out of these surfaces. Some appreciation of this point can be ascertained from the realization that the showing in FIG. 1 is approximately twice actual size.

In accordance with the embodiment shown in FIG. 1, block 10 is made to include projecting walls 18 spaced apart to define recesses, indicated by reference numerals 20, which extend along the length of the block. In the bottom of each recess is an opening shown as 22 which is part of an aperture 24, the block 10 having plural apertures 24 as shown, extending through the block to the upper surface 12 thereof. In accordance with an aspect of the invention to be described in detail hereinafter, an extension of conductive material shown as 26 is positioned within each of the apertures 24 and is joined to contact surfaces 14. In the preferred embodiment the conductive material 26 is formed by depeositing conductive plastic onto the surfaces of the apertures 24 to form a generally tubular conductive receptacle.

A series of connector blocks shown as 30 are dimensioned to fit within the recesses 20. The connector blocks 30 each include an array of contact spring members shown as 32 which fit within conductive receptacles 26 in apertures 24 of the block 10. The contact members 32 are each connected to electrical leads shown as 34 which go to circuit components operated by closure of selected electrical paths through the contact surfaces 14 and the contact springs 16.

In FIG. 2 the end of a contact spring 16 is shown in engagement with the conductive contact surface 14. In normal use, engagement of a spring 16 with its corresponding contact surface or pad 14 is made through a wiping engagement under pressure in order to clear the surface 14 of card dust or the like contaminants and to clear the engaging surfaces of any oxides which may have formed on either the spring 16 or the surface 14. In a typical application, for example, the force of engagement of the contact springs is on the order of 28–32 grams. In an actual embodiment the contact springs 16 are approximately 0.008 of an inch in width with a curved configuration generally as shown to develop a very substantial force per square inch.

Figure 3A:
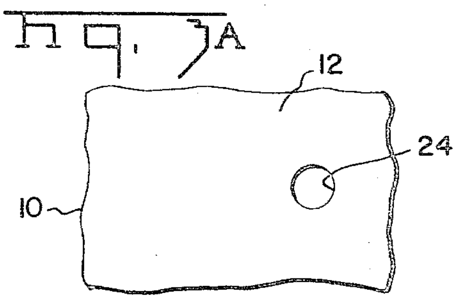
FIGS. 3*a*–3*d* are plan views showing the several steps of forming a contact surface on an insulating board in accordance with the method of the invention in a preferred embodiment.
Figure 3B:
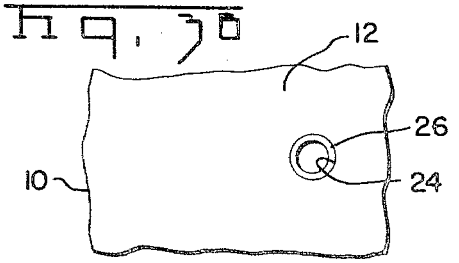
Figure 3C:
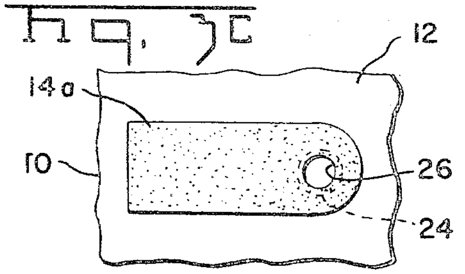

In accordance with the invention as depicted in FIGS. 3*a*–5*b*, the conductive surfaces were formed as follows. Beginning with a surface cleaned block having a configuration as shown in FIGS. 1, 3*a*, and 4*a* formed of a relatively hard thermoplastic insulating material such as a glass filled polycarbonate having the apertures 24 molded therein, the first step in accordance with the invention is to form the conductive surfaces 26 within apertures 24. This may be done in a number of ways including covering the upper surface 12 of block 10 with conductive liquid or ink and drawing such liquid or ink into apertures 24 by vacuum until the surfaces within the apertures are coated. In accordance with the inveniton, a preferred liquid or ink is comprised of an epoxy loaded with silver particles. The epoxy-silver material is initially in a liquid form, but includes a catalyst to cause setting and curing after a period of time which may be accelerated by the application of heat. Upon curing the epoxy serves as an adhesive bonding the coating to the walls of the apertures. In the event that the conductive material 26 is coated on the walls of the apertures in the foregoing fashion, after such material 26 has set and at least partially cured to a hard state, the top surface 12 may then be cleaned as by abrading or sanding off any of the conductive ink from the surface thereof to leave the structure as shown in FIGS. 3*b* and 4*b*. Next, in accordance with the invention, the conductive contact surfaces or pads 14 are formed in a manner shown in FIGS. 3*c* and 4*c* with conductive ink deposited in the pattern represented by numeral **14*a***. FIG. 5*a* depicts the layer of ink enlarged from actual size. The depositing of the ink in the pattern of **14*a*** may be achieved by any suitable technique including coating by painting, silk screening, or the like. For the configuration shown, silk screening is preferred. In the step depicted in FIGS. 3*c* and 4*c* the ink forming the pattern **14*a* is made to overlap and thus join the coating 26** to form an integral and continuous conductive layer.

Figure 3D:
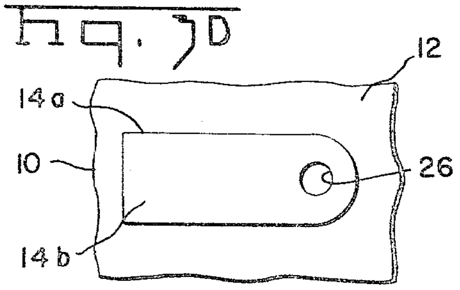
Figure 4A:
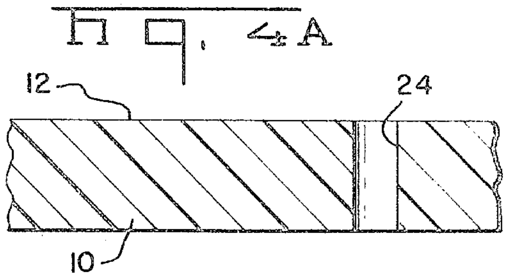
FIGS. 4*a*–4*d* are side and partially sectioned views of the structure as shown in FIGS. 3*a*–3*d*.
Figure 4B:
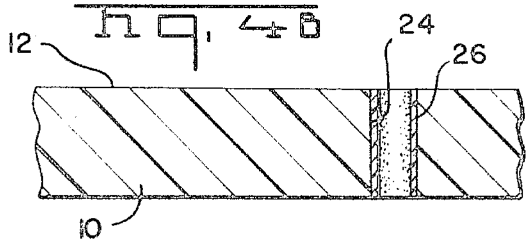
Figure 4C:
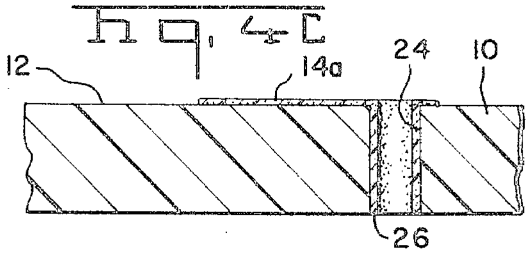
Figure 4D:
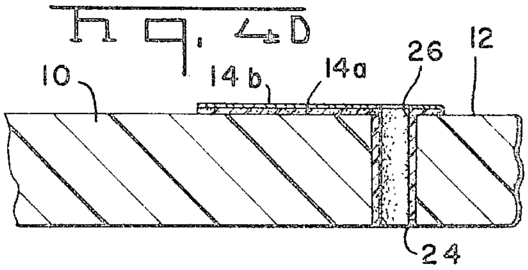
Figures 5A, 5B:
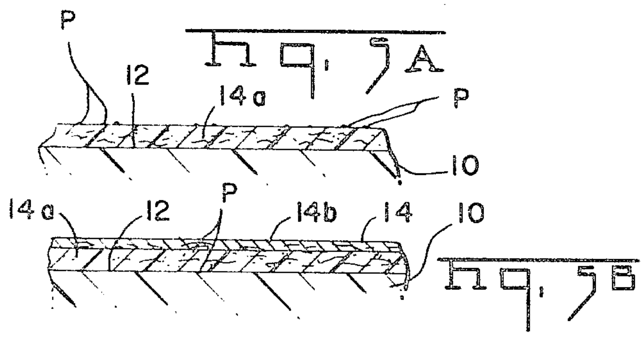
FIGS. 5*a* and 5*b* are side sectional views, considerably enlarged, of the contact surfaces of FIGS. 3*c*, 4*c*, and 3*d*, 4*d*, respectively.

After the ink of **14*a*** has set and at least partially cured to a hard state, a layer of conductive metal is applied thereto as shown in FIGS. 3*d* and 4*d* by numeral **14*b*. In accordance with the invention, layer 14*b* is comprised of an electroless metal deposited by an electroless technique. Normally this final step would have to be achieved by catalyzing each of the ink surfaces or pads 14*a*** individually as by touching these surfaces with a catalyzing member such as an iron rod. As can be appreciated by those skilled in this particular art, the particular configuration called for in applications of the type here represented make such an approach not only extremely expensive but also almost completely impractical from a production standpoint.

In accordance with an important aspect of the invention, the conductive ink employed to form both the conductive coatings 26 within the small apertures and the pattern **14*a* of conductive contact surfaces 14** incorporates a catalyzing agent in the form of small particles or flakes mixed into the ink prior to deposition. These particles are shown as P in FIGS. 5*a* and 5*b*. Sufficient particles are included in the ink to provide a particle dispersion resulting in a complete and substantially homogeneous plating onto the inked surfaces. It is believed that reduction of electroless plating starts or is initiated at each particle location on the surface of the inked material and spreads laterally until there is an overlap of plated material from adjacent particle sites with a resulting build-up of plating material to a desired thickness. After initial reduction of the electroless material on or about each particle subsequent plating results by auto-reduction.

The foregoing technique according to the invention has been disclosed relative to a specific application. It should be appreciated, however, and it is fully contemplated herein, that the invention lends itself to a variety of other applications equally well, and more particularly to applications wherein contact surfaces of peculiar configurations may be involved and especially to contact surface configurations which are very small and/or which must be electrically linked through fine apertures or holes in insulating structures.

The term "electroless plating" is considered to be well undestood by those skilled in the plating arts. A number of electroless plating materials are commercially available, such as nickel or gold. These materials have different characteristics but for each a number of catalyzing agents are available and the invention contemplates the use of different electroless plating materials and different catalysts, those capables of initiating reduction of the plating material employed.

A reference which reviews one accepted electroless plating technique is found in the publication "Symposium on Electroless Nickel Plating," ASTM Technical Publication No. 265, American Society for Testing, Baltimore, Md., 1956.

In an actual embodiment for use with a card reader accommodating data cards having 264 possible bit position arranged in a 12 x 22 array, some 264 conductive surfaces like surfaces 14 approximately 0.200 of an inch in length and 0.070 of an inch in width were formed on the surface of a block10 made of a glass-filled thermoplastic polysulfide material. The block contained one aperture for each contact surface approximately 0.020 of an inch in diameter and approximately 0.100 of an inch in length. The surfaces of the block prior to receiving a deposit of conductive ink were first prepared by cleaning through flushing with cold water. A conductive ink in the form of a liquid, silver loaded epoxy having or containing either nickel particles or aluminum particles mixed therein was deposited on the surfaces of the apertures 24 forming layers or coating 26 in a thickness of approximately 0.0005 to 0.001 of an inch. In either instance, whether using particles of nickel or particles of aluminum, the average particle size was about 8 microns. After such material had hardened sufficiently, the surface 12 was cleaned by abrading in preparation for silk screening. The conductive contact surfaces or pads 14*a* were then applied by silk screening on the same liquid, silver loaded epoxy ink, loaded with either nickel particles or aluminum particles, to a thickness of approximately 0.0005 to 0.001 of an inch, which was then permitted to harden almost completely. The block was then vapor blasted with aluminum oxide to clean the surfaces 14*a* and to better expose the particles of nickel or aluminum and rinsed in flowing cold water to remove the abrasive. After drying the block was then suspended in a commercial electroless nickel solution such as that of Shippley Corporation, Newton, Mass., identified as NL–61 to provide a plating 14*b* to a thickness of about 0.0002 to 0.0005 of an inch.

The following represent examples of ink systems of the invention based on different resins and catalytic agents.

Example I

A conductive ink including catalyzing particles was formed of Du Pont No. 3817 epoxy paint including nickel flakes of a minum 325 mesh size mixed in a ratio by weight of 1 grams of paint to ½ gram of nickel flakes. The ink so formed was applied in a thin coat (0.000 to 0.001 of an inch) to a glass substrate vapor blasted with 180 mesh aluminum oxide. After drying for one hour at 100° C. the sample was plated with the above-mentioned electroless nickel to a thickness of approximately 0.0002 to 0.0005 of an inch.

Example II

Another conductive ink including catalyzing particles was made with Du Pone No. 3817 epoxy paint including flakes of aluminum also of a minus 325 mesh size but mixed in a ratio by weight of 1 gram of paint to ¼ gram of aluminum flakes. This ink was applied in a similar thin coat (see Example I) to a glass substrate vapor blasted with 189 mesh aluminum oxide. This sample was then dried and plated with electroless nickel in the same way as in Example I.

Example III

A two component commercial epoxy sample based on a mixture of 10 grams of Epon No. 828 epoxy resin and 1 gram of TETA epoxy catalyst was mixed with 10 grams of nickel flakes of minus 325 mesh size. This mixture was applied in a thin coat to a substrate as in Example I and permitted to air dry overnight. Thereafter, the sample was then plated with the electroless nickel as previously disclosed.

Example IV

The sample of Example III was repeated using a similar mixture by weight of aluminum flakes of similar size.

Example V

A plastic base of 75 milliliters of $CH_2Cl_2$, 25 milliliters of $CH_3COOH$ and 20 grams of Lucite powder were mixed together by slowly adding the Lucite powder and stirring constantly to dissolve the powder added. Particles of nickel in the form of minus 325 mesh flakes were then mixed on the basis of a one to one by weight ratio of particles to the resin concentration of Lucite powder. The resulting mixture was then coated onto a glass substrate abraded by vapor blasting with aluminum oxide particles of 180 mesh size. After drying the sample was plated with the aforementioned electroless nickel.

Example VI

A plated substrate was provided as in Example V using flakes of aluminum of similar size and in similar mixture, in lieu of nickel flakes.

The foregoing examples have resulted in a finish plate of electroless material. It is also contemplated that such finish plate may be the base for immersion deposits of gold or other metals. In the foregoing examples the ink has been described as containing a dispersion of catalytic particles which is a distinct aspect of the invention. Another aspect of the invention also contemplates a surface disposition of catalytic particles, partially embedded in the ink material in a suitable manner as by spraying, dusting, or rolling particles into an undried ink coating. A further aspect is that although the ink of the preferred embodiment is a conductive ink, i.e., it is made conductive by loading with silver particles or the like, the ink to which the catalytic particles or flakes are added may equally well be a non-conductive ink. The catalytic agent for initiating electroless plating in accordance with the invention will accomplish its purposes equally well in either conductive inks or non-conductive inks.

Having now disclosed the invention in terms intended to enable a preferred practice thereof in its various modes, the invention is defined in the appened claims.

What is claimed is:

1. A method of providing an electrical contact surface which comprises:

selectively applying a thin coating of a conductive ink to an insulating substrate, said ink containing a curable resin composition, and having dispersed therein sufficient conductive silver particles to render said ink conductive, and catalytic particles which are catalytic to the deposition of a subsequent electroless coating of nickel, curing said resin composition, and thereafter, contacting said ink with an electroless nickel bath whereby nickel is plated onto said ink coating.

2. The method of claim 1 wherein said curable resin composition is a curable epoxy resin composition.

3. The method of claim 1 wherein said cured ink coating is roughened to assure exposure of said catalytic particles with the surface thereof.

4. The method of claim 1 wherein said contact surface comprises a planar plastic substrate having a plurality of apertures extending through said substrate, and wherein said ink and subsequently applied electroless nickel coatings are applied to the side walls of said apertures, and are also applied to the planar surfaces of said substrate adjacent to each of said apertures so as to provide conductive paths extending from said holes onto said planar surfaces.

(References on following page)

References Cited

UNITED STATES PATENTS

| | | | |
|---|---|---|---|
| 2,280,135 | 4/1942 | Ward | 252—513 X |
| 2,641,675 | 6/1953 | Hannahs | 252—513 X |
| 2,795,680 | 6/1957 | Peck | 252—512 X |
| 3,226,256 | 12/1965 | Schneble et al. | 117—217 X |
| 3,259,559 | 7/1966 | Schneble, Jr., et al. | 117—212 X |
| 3,146,125 | 8/1964 | Schneble, Jr., et al. | 117—212 X |
| 3,332,860 | 7/1967 | Diebold et al. | 204—38 |

RALPH S. KENDALL, Primary Examiner

U.S. Cl. X.R.

117—213, 217